(12) United States Patent
Nagano et al.

(10) Patent No.: US 11,196,336 B2
(45) Date of Patent: Dec. 7, 2021

(54) GATE DRIVE APPARATUS AND SWITCHING APPARATUS

(71) Applicant: FUJI ELECTRIC CO., LTD., Kanagawa (JP)

(72) Inventors: Tsuyoshi Nagano, Hino (JP); Kunio Matsubara, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/159,109

(22) Filed: Jan. 26, 2021

(65) Prior Publication Data

US 2021/0152171 A1 May 20, 2021

Related U.S. Application Data

(63) Continuation of application No. PCT/JP2019/045973, filed on Nov. 25, 2019.

(30) Foreign Application Priority Data

Jan. 10, 2019 (JP) .............................. JP2019-002954

(51) Int. Cl.
*H02M 1/08* (2006.01)
*H02M 1/00* (2006.01)
*H03K 17/16* (2006.01)

(52) U.S. Cl.
CPC ........... *H02M 1/0054* (2021.05); *H02M 1/08* (2013.01); *H03K 17/165* (2013.01)

(58) Field of Classification Search
CPC ..... H02M 1/0054; H02M 1/08; H03K 17/165
USPC .......................................... 327/108, 109, 110
See application file for complete search history.

(56) References Cited

U.S. PATENT DOCUMENTS

| 10,425,080 B1* | 9/2019 | Lam ..................... H03K 5/1565 |
| 2005/0206438 A1* | 9/2005 | Higashi ................ H03K 17/166 327/427 |
| 2015/0035569 A1 | 2/2015 | Miura |
| 2015/0256105 A1 | 9/2015 | Kano |
| 2018/0069544 A1 | 3/2018 | Mauder |

FOREIGN PATENT DOCUMENTS

| JP | 2005278274 A | 10/2005 |
| JP | 2008193717 A | 8/2008 |
| JP | 4935266 B2 | 5/2012 |
| JP | 2015142155 A | 8/2015 |
| JP | 6266478 B2 | 1/2018 |
| JP | 6290118 B2 | 3/2018 |

OTHER PUBLICATIONS

International Search Report and (ISA/237) Written Opinion of the International Search Authority for International Patent Application No. PCT/JP2019/045973, mailed by the Japan Patent Office dated Feb. 25, 2020.

* cited by examiner

*Primary Examiner* — William Hernandez (57) ABSTRACT

A gate drive apparatus including a gate drive unit configured to drive a gate of a switching device, a peak detection unit configured to detect that a voltage across main terminals applied between the main terminals of the switching device during a turn-off period of the switching device is at a peak, and a driving condition changing unit configured to increase a change speed of a gate voltage of the switching device caused by the gate drive unit, in response to a detection that the voltage across main terminals is at a peak.

11 Claims, 4 Drawing Sheets

GATE DRIVE APPARATUS AND SWITCHING APPARATUS

The contents of the following Japanese patent application are incorporated herein by reference:
2019-002954 filed in JP on Jan. 10, 2019
PCT/JP2019/045973 filed in WO on Nov. 25, 2019

BACKGROUND

1. Technical Field

The present invention relates to a gate drive apparatus and a switching apparatus.

2. Related Art

Traditionally, a gate drive apparatus for driving a gate of a switching device has a reduced change speed of a gate voltage in order to reduce the surge voltage at the time of turn-off (see Patent documents 1 to 3, for example).
Patent document 1: Japanese Patent No. 6290118 specification
Patent document 2: Japanese Patent No. 6266478 specification
Patent document 3: Japanese Patent No. 4935266 specification When the change speed of a gate voltage is reduced, the turn-off loss becomes larger.

SUMMARY

In the first aspect of the present invention, a gate drive apparatus is provided. The gate drive apparatus may include a gate drive unit configured to drive a gate of a switching device. The gate drive apparatus may include a peak detection unit configured to detect that a voltage across main terminals applied between the main terminals of the switching device during a turn-off period of the switching device is at a peak. The gate drive apparatus may include a driving condition changing unit configured to increase a change speed of a gate voltage of the switching device caused by the gate drive unit, in response to a detection that the voltage across main terminals is at a peak.

The peak detection unit may include a voltage detection circuit configured to detect the voltage across main terminals. The peak detection unit may include a comparator configured to compare a parameter according to the voltage across main terminals with a reference value. The peak detection unit may include a detection unit configured to detect that the voltage across main terminals is at a peak, based on a comparison result obtained by the comparator.

The peak detection unit may further include a differential processing unit configured to detect, as the parameter, a value according to a change rate of the voltage across main terminals. The comparator may be configured to compare the parameter with the reference value indicating that the change rate is a reference change rate that is equal to or below zero.

The peak detection unit may further include a low-pass filter at a front part or a back part of the differential processing unit.

The comparator may be configured to compare the parameter with the reference value indicating that the voltage across main terminals is at a peak.

The driving condition changing unit may be configured to reduce a resistance value of a gate resistor connected to the gate in a case where it is detected that the voltage across main terminals is at a peak as compared to a case where it is not detected that the voltage across main terminals is at a peak.

The driving condition changing unit may be configured to reduce the resistance value of the gate resistor connected to the gate from a moment when it is detected that the voltage across main terminals is at a peak at least until a current between the main terminals of the switching device is cut-off, or until the voltage across main terminals turns into a direct current voltage applied between the main terminals.

The driving condition changing unit may be configured to increase a gate current of the switching device in a case where it is not detected that the voltage across main terminals is at a peak as compared to a case where it is detected that the voltage across main terminals is at a peak.

The gate drive apparatus may include a temperature sensor configured to measure a temperature of the switching device. The gate drive apparatus may include an enabling unit configured to enable the peak detection unit and the driving condition changing unit in response to the temperature being higher than a reference temperature.

In a second aspect of the present invention, a switching apparatus is provided. The switching apparatus may include a gate drive apparatus according to the first aspect. The switching apparatus may include a switching device of which a gate is to be driven by the gate drive apparatus. The switching device may be a wide bandgap semiconductor element.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments are not intended to limit the invention of the claims. In addition, all combinations of features described in the embodiments are not necessarily essential to solutions provided by the present invention. Note that, common arrangements are provided with the same reference number throughout the embodiments, and overlapping descriptions will be omitted.

1. Configuration of Switching Apparatus 100

Figure 1:
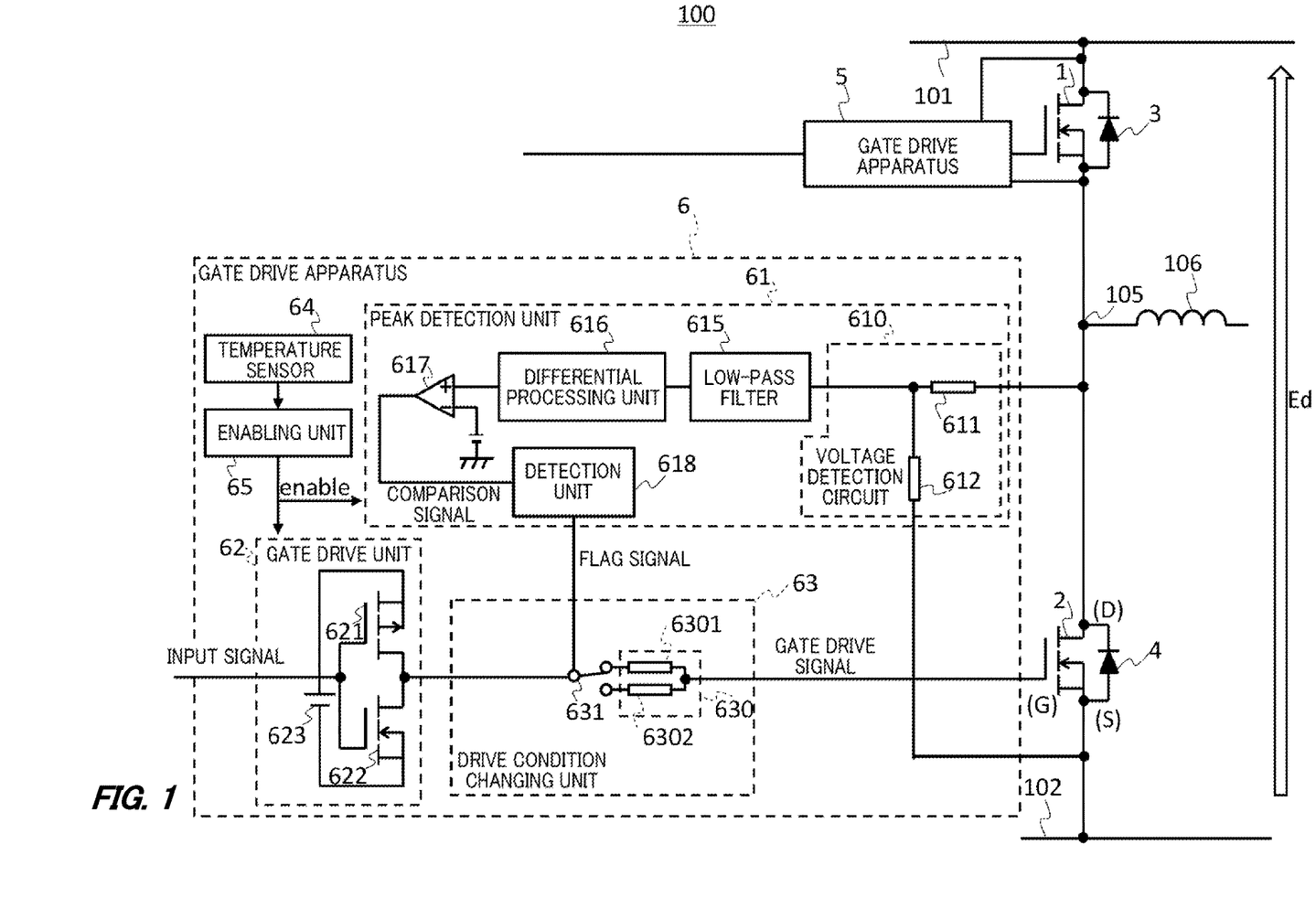
FIG. 1 shows a switching apparatus 100 according to the present embodiment.

FIG. 1 shows a switching apparatus 100 according to the present embodiment. Note that, in the figure, an outlined arrow indicates a voltage.

The switching apparatus 100 shows one phase of a power conversion apparatus that is used for motor drive or power feed, as an example, and is configured to output a voltage converted from a power supply output terminal 105 by switching connection between a positive-side power supply line 101 and a negative-side power supply line 102 and the power supply output terminal 105.

Here, a direct current voltage Ed of 600 to 800V, for example, is applied between the positive-side power supply line 101 and the negative-side power supply line 102, and the negative-side power supply line 102 is connected to a reference potential (as an example, a ground potential) of the entire switching apparatus 100. The power supply output terminal 105 may have an induction load 106 connected thereto. The switching apparatus 100 includes a positive-side main switching device 1, a negative-side main switching device 2, freewheeling diodes 3 and 4 connected in antiparallel to the main switching devices 1 and 2, a positive-side gate drive apparatus 5 and a negative-side gate drive apparatus 6.

[1-1. Main Switching Devices 1 and 2]

The main switching devices 1 and 2 are respectively an example of a switching device, and are configured to electrically connect or disconnect between a drain terminal and a source terminal. For example, the main switching devices 1 and 2 are configured to switch between an on-state (also referred to as connected) and an off-state (also referred to as disconnected) by gate drive apparatuses 5 and 6, which will be described below. Here, in the present embodiment, as an example, the main switching devices 1 and 2 are sequentially connected in series between the negative-side power supply line 102 and the positive-side power supply line 101, and constitute an upper arm and a lower arm of the power conversion apparatus. A center point between the main switching devices 1 and 2 has the power supply output terminal 105 connected thereto.

Each of the main switching devices 1 and 2 is a silicon semiconductor element based on silicon. Alternatively, at least one of the main switching devices 1 and 2 may be a wide bandgap semiconductor element. The wide bandgap semiconductor element is a semiconductor element in which the bandgap is greater than that of a silicon semiconductor element, and is, for example, a semiconductor element including SiC, GaN, diamond, a gallium nitride-based material, a gallium oxide-based material, AlN, AlGaN, ZnO, or the like. The wide bandgap semiconductor element enables the switching speed to be improved, as compared to the silicon semiconductor element. Note that, in the present example, the main switching devices 1 and 2 are respectively a MOSFET (Metal Oxide Semiconductor Field Effect Transistor), and may include a parasitic diode (not illustrated) of which the side facing toward the positive-side power supply line 101 is a cathode.

[1-2. Freewheeling Diodes 3 and 4]

The freewheeling diodes 3 and 4 are connected in antiparallel to the main switching devices 1 and 2. The freewheeling diodes 3 and 4 may respectively be a Schottky barrier diode or may be a parasitic diode of a MOSFET. The freewheeling diodes 3 and 4 may respectively be a silicon semiconductor element or may be a wide bandgap semiconductor element.

[1-3. Gate Drive Apparatuses 5 and 6]

The gate drive apparatuses 5 and 6 are configured to drive the gates of the corresponding main switching devices 1 and 2, based on an input signal which is input from an outside. The input signal may control the main switching devices 1 and 2 in a PWM control manner, thereby outputting alternating current of a substantial sine wave from the power supply output terminal 105. The input signal may be individually input to the main switching device 1 and the main switching device 2. Note that, in the present embodiment, as an example, in a case where the input signal is high (on-command signal), it instructs the main switching device 2 to be in an on state, and in a case where the input signal is low (off-command signal), it instructs the main switching device 2 to be in an off-state.

The positive-side gate drive apparatus 5 is configured to drive the gate of the main switching device 1, and the negative-side gate drive apparatus 6 is configured to drive the gate of the main switching device 2. Note that, the gate drive apparatuses 5 and 6 have similar configurations. Therefore, in the present embodiment, the negative-side gate drive apparatus 6 is described, and the descriptions of the positive-side gate drive apparatus 5 are omitted.

The gate drive apparatus 6 includes a peak detection unit 61, a gate drive unit 62, a driving condition changing unit 63, a temperature sensor 64, and an enabling unit 65. In the present embodiment, as an example, each unit of the gate drive apparatus 6 is described as an analog circuit. Note that, the gate drive apparatus 6 does not necessarily have to be provided with the temperature sensor 64 and the enabling unit 65.

[1-3-1. Peak Detection Unit 61]

The peak detection unit 61 is configured to detect that a voltage across main terminals applied between the main terminals of the main switching device 2 during a turn-off period of the main switching device 2 is at a peak. In the present embodiment, as an example, the peak detection unit 61 is configured to detect that a voltage $V_{ds}$ applied between the drain terminal and the source terminal of the main switching device 2 is at a peak. When the peak detection unit 61 detects that the voltage $V_{ds}$ is at a peak, a flag signal for changing the gate drive condition for the main switching device 2 is supplied to the driving condition changing unit 63. The peak detection unit 61 includes a voltage detection circuit 610, a low-pass filter 615, a differential processing unit 616, a comparator 617, and a detection unit 618.

[1-3-1-1. Voltage Detection Circuit 610]

The voltage detection circuit 610 is configured to detect the voltage $V_{ds}$. For example, the voltage detection circuit 610 includes resistors 611 and 612 for dividing the voltage $V_{ds}$. The center point of the resistors 611 and 612 is connected to the low-pass filter 615, and supplies the detected voltage to the low-pass filter 615. Note that, in the present embodiment, the detected voltage is a positive voltage when the potential on the drain terminal side is higher than that on the source terminal side.

[1-3-1-2. Low-Pass Filter 615]

The low-pass filter 615 is configured to perform filtering for removing, from the voltage signal detected by the voltage detection circuit 610, frequency components that are higher than a preset cut-off frequency. The cut-off frequency may be larger than the switching frequency of the main switching devices 1 and 2. The low-pass filter 615 is configured to supply the filtered voltage signal to the differential processing unit 616.

[1-3-1-3. Differential Processing Unit 616]

The differential processing unit 616 is configured to detect, as a parameter, a value according to a change rate of the voltage $V_{ds}$. The differential processing unit 616 may be a differential circuit, and as an example, may be a passive differential circuit (also referred to as an RC circuit) including a resistor and a capacitor, or may be an active differential circuit including an operational amplifier, a resistor, and a capacitor. The differential processing unit 616 is configured to supply the detected parameter to the comparator 617.

[1-3-1-4. Comparator 617]

The comparator 617 is configured to compare the parameter detected by the differential processing unit 616 with a reference value, and supply a comparison signal indicating the comparison result to the detection unit 618. In the present embodiment, as an example, a non-inverting input terminal of the comparator 617 receives a voltage indicating the parameter detected by the differential processing unit 616, and an inverting input terminal receives a voltage indicating the reference value. The reference value may be a value indicating that the change rate of the voltage $V_{ds}$ is a reference change rate (in the present embodiment, as an example, zero). When the reference change rate is zero, it is indicated by the comparison signal that the positive-negative polarity of the parameter has inverted, that is, that the voltage $V_{ds}$ is at a maximum peak or minimum peak.

[1-3-1-5. Detection Unit 618]

The detection unit 618 is configured to detect that the voltage $V_{ds}$ is at a peak based on the comparison result obtained by the comparator 617. For example, the detection unit 618 may detect that the voltage $V_{ds}$ is at a peak in response to a rising or falling of the comparison signal. The detection unit 618 is configured to supply, to the driving condition changing unit 63, a signal (also referred to as a flag signal) which becomes a high level in response to the detection that the voltage $V_{ds}$ is at a peak.

[1-3-2. Gate Drive Unit 62]

The gate drive unit 62 is configured to drive the gate of the main switching device 2, based on a turn-on signal and a turn-off signal included in an input signal from the outside. The gate drive unit 62 includes a first switching device 621, a second switching device 622, and a power source 623.

The first switching device 621 and the second switching device 622 are connected in series. The first switching device 621 and the second switching device 622 are configured to supply gate drive signals (on-command signal/off-command signal) for on/off instructions to a gate terminal of the main switching device 2.

For example, the first switching device 621 is connected between a first potential (20V, as an example) that is higher than the reference potential of the negative-side power supply line 102 and the gate terminal of the main switching device 2. In this way, when the first switching device 621 is turned on, the gate drive signal driving the gate of the main switching device 2 becomes high, and the main switching device 2 is turned on. In the present embodiment, as an example, the first switching device 621 is a P-type MOSFET, and has its source terminal connected to the first potential side, its drain terminal connected to the gate terminal side of the main switching device 2, and its gate terminal connected to the input terminal side of the input signal. In this way, the input signal becomes high, thereby turning the first switching device 621 into an ON state.

The second switching device 622 is connected between a second potential (−5V, as an example) that is lower than the reference potential, and the gate terminal of the main switching device 2. In this way, when the second switching device 622 is turned on, the gate drive signal becomes low and the main switching device 2 is turned off. In the present embodiment, as an example, the second switching device 622 is a N-type MOSFET, and has its source terminal connected to the second potential side, its drain terminal connected to the gate terminal side of the main switching device 2, and its gate terminal connected to the input terminal side of the input signal. In this way, the input signal becomes low, thereby turning the second switching device 622 into an ON state.

Note that, the first switching device 621 and the second switching device 622 are not limited to a MOSFET, and may be a semiconductor element having other structures, such as a bipolar transistor.

The power source 623 supplies a direct current voltage to series circuits of the first switching device 621 and the second switching device 622. In the present embodiment, as an example, the first switching device 621 side of the power source 623 is the first potential, and the second switching device 622 side of the power source 623 is the second potential. Note that, as long as the source terminal of the first switching device 621 is connected to the first potential side and the source terminal of the second switching device 622 is connected to the second potential side, the power source 623 may not be provided.

[1-3-3. Driving Condition Changing Unit 63]

The driving condition changing unit 63 is configured to change the driving condition such that the change speed of the gate voltage of the main switching device 2 caused by the gate drive unit 62 is increased, in response to the detection that the voltage $V_{ds}$ is at a peak. The driving condition changing unit 63 includes a gate resistor 630 and a connection switch unit 631.

The gate resistor 630 includes two different gate resistors 6301 and 6302 having resistance values that are different from each other. The resistance value of the gate resistor 6301 may be larger than the resistance value of the gate resistor 6302. In the present embodiment, as an example, the gate resistors 6301 and 6302 respectively have one end connected to the gate of the main switching device 2 and the other end connected to the connection switch unit 631. Note that, the gate resistor 630 may have other configurations, as long as the resistance value can be changed during a turn-off period of the main switching device 2. As an example, the gate resistors 6301 and 6302 may be connected in parallel between the second switching device 622 and the power source 623.

The connection switch unit 631 is configured to electrically connect either one of the two gate resistors 6301 and 6302 to the gate in an alternative manner. The connection switch unit 631 may electrically connect the other end (the end opposite to the gate side) of either of the gate resistors 6301 and 6302 to the gate drive unit 62, according to the flag signal. For example, the connection switch unit 631 may perform the switching such that the resistance value of the gate resistor 630 connected to the gate is reduced in a case where it is detected that the voltage $V_{ds}$ is at a peak, that is, a case where the flag signal is at a high level, as compared to a case where it is not detected that the voltage $V_{ds}$ is at a peak, that is, a case where the flag signal is at a low level. In the present embodiment, as an example, the connection switch unit 631 is configured to continue to connect the gate resistor 6301 having a large resistance value to the gate, when a high level flag signal is not received from the detection unit 618 during a turn-off period of the main switching device 2. In addition, the connection switch unit 631 is configured to connect the gate resistor 6302 having a small resistance value to the gate, when a high level flag signal is received from the detection unit 618 during a turn-off period of the main switching device 2. In this way, the change speed of the gate voltage of the main switching device 2 is increased in response to the detection that the voltage $V_{ds}$ is at a peak.

[1-3-4. Temperature Sensor 64]

The temperature sensor 64 is configured to measure the temperature of the main switching device 2. The temperature sensor 64 may supply a current or a voltage according to the measured temperature to the enabling unit 65.

[1-3-5. Enabling Unit 65]

The enabling unit 65 is configured to activate (enable) the peak detection unit 61 and the driving condition changing unit 63 in response to the temperature measured by the temperature sensor 64 being higher than a reference temperature. The enabling unit 65 may supply an enabling signal to the peak detection unit 61 and the driving condition changing unit 63 when the measured temperature is higher than the reference temperature. The reference temperature may be 125 degrees Celsius when the main switching device 2 is a silicon semiconductor element, and may be 175 degrees Celsius when the main switching device 2 is a wide bandgap semiconductor element such as a SiC. Note that, in a case where the measured temperature is equal to or below the reference temperature, the peak detection unit 61 and the driving condition changing unit 63 may be maintained in a disabled state. In this case, the connection switch unit 631 of the driving condition changing unit 63 may electrically connect the gate resistor 6301 having a large resistance value to the main switching device 2.

According to the above-described switching apparatus 100, turn-off after the voltage $V_{ds}$ is at a peak is quickly completed, since the change speed of the gate voltage of the main switching device 2 is increased in response to the detection that the voltage $V_{ds}$ during a turn-off period of the main switching device 2 is at a peak. Therefore, the time required for turn-off can be shortened and a turn-off loss can be reduced, as compared to a case where the change speed of the gate voltage does not increase. In addition, since the change speed of the gate voltage increases after the peak of the voltage $V_{ds}$, increase in the peak voltage, and thus, in the surge voltage can be prevented.

In addition, since the resistance value of the gate resistor 630 is reduced in a case where it is detected that the voltage $V_{ds}$ is at a peak, as compared to a case where it is not detected that the voltage $V_{ds}$ is at a peak, the change speed of the gate voltage can be reliably increased.

In addition, since either one of the two gate resistors 6301 and 6302 having resistance values that are different from each other is connected to the gate of the main switching device 2 in an alternative manner, the change speed of the gate voltage can be reliably increased by connecting the gate resistor 6302 having a small resistance value to the gate in response to the detection that the voltage $V_{ds}$ is at a peak.

In addition, since the voltage $V_{ds}$ is detected by the voltage detection circuit 610 and it is detected that the voltage $V_{ds}$ is at a peak based on the result of comparison between a parameter according to the voltage $V_{ds}$ and a reference value, it can be reliably detected that the voltage $V_{ds}$ is at a peak.

In addition, since a value according to the change rate of the voltage $V_{ds}$ is used as the parameter and it is compared with the reference value indicating that the change rate is zero, it can be reliably detected that the voltage $V_{ds}$ is at a peak.

In addition, since a low-pass filter 615 is provided at the front part of the differential processing unit 616, the influence of noises is reduced and it can be reliably detected that the voltage $V_{ds}$ is at a peak.

In addition, since the peak detection unit 61 and the driving condition changing unit 63 are enabled in response to the device temperature of the main switching device 2 being higher than a reference temperature, the turn-off loss is originally small due to a low device temperature, and the life of the switching apparatus 100 can be extended by preventing the operation of the peak detection unit 61 and the driving condition changing unit 63 when the effect obtained by changing the driving condition is small.

2. Operations

Figure 2:
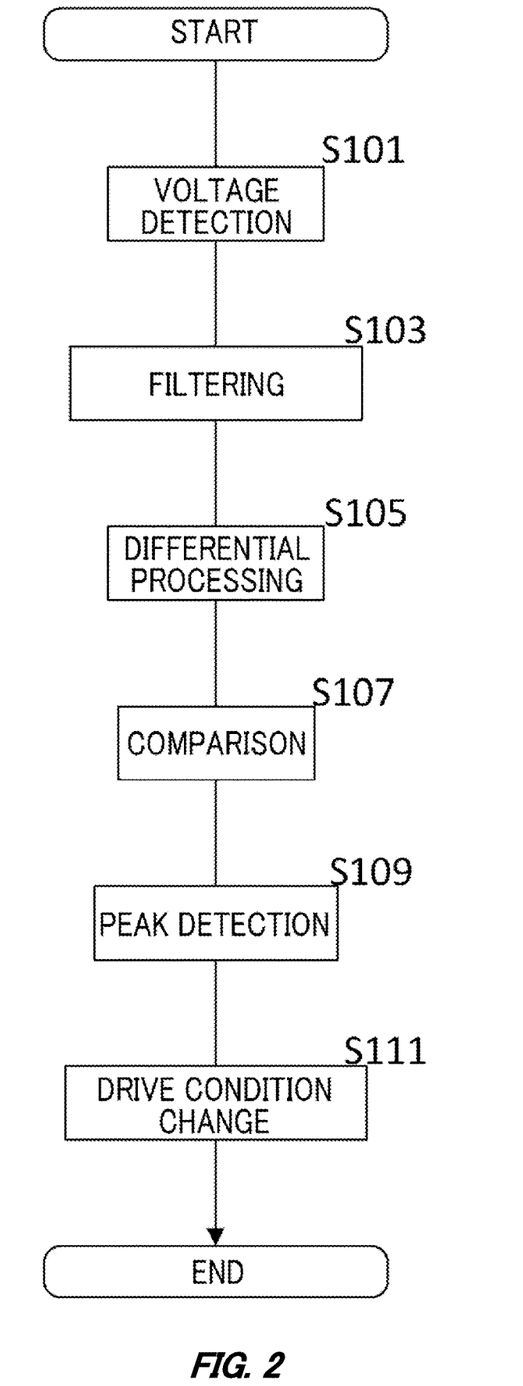
FIG. 2 shows an operation of the switching apparatus 100.

FIG. 2 shows an operation of the switching apparatus 100. The switching apparatus 100 is configured to change the driving condition by performing the processes of steps S101 to S111 during a turn-off period of the main switching device 2.

At step S101, the voltage detection circuit 610 detects the voltage $V_{ds}$ applied between the drain terminal and the source terminal of the main switching device 2.

At step S103, the low-pass filter 615 performs filtering for removing high frequency components on the detected voltage signal.

At step S105, the differential processing unit 616 detects, as a parameter, a value according to the change rate of the voltage $V_{ds}$. In the present embodiment, as an example, the differential processing unit 616 detects, as the parameter, the change rate $dV_{ds}/dt$ of the voltage $V_{ds}$, but it may detect, as the parameter, the value obtained by performing calculation such as addition/subtraction, multiplication and division on $dV_{ds}/dt$.

At step S107, the comparator 617 compares the parameter detected by the differential processing unit 616 with a reference value. In the present embodiment, as an example, the comparator 617 compares the parameter which is the change rate $dV_{ds}/dt$ of the voltage $V_{ds}$ with zero. Note that, the processes of the above-mentioned steps S101 to S107 may be performed continuously until the peak of the voltage $V_{ds}$ is detected at step S109 described below.

At step S109, the detection unit 618 detects that the voltage $V_{ds}$ is at a peak based on the comparison result obtained by the comparator 617. In the present embodiment, as an example, the detection unit 618 detects that the voltage $V_{ds}$ is at a peak in response to the falling of the comparison signal, and outputs a flag signal at a high level. The detection unit 618 may maintain the flag signal at a high level from a moment when it is detected that the voltage $V_{ds}$ is at a peak until at least when the current between the drain and the source of the main switching device 2 is cut off. The detection unit 618 may maintain the flag signal at a high level from a moment when it is detected that the voltage $V_{ds}$ is at a peak until at least when the voltage $V_{ds}$ turns into a direct current voltage Ed. The detection unit 618 may switch the flag signal to a low level by the next time the main switching device 2 is turned off. As an example, the detection unit 618 may switch the flag signal to a low level at a time point where the voltage $V_{ds}$ has decreased from the peak voltage and reached the direct current voltage Ed, or a time point where a reference time period (as an example, half of the time of the switching cycle of the main switching devices 1 and 2) has elapsed from said time point. Alternatively, the detection unit 618 may switch the flag signal to a low level when the flag signal continues to be at a high level beyond the reference time period.

At step S111, the driving condition changing unit 63 increases the change speed of the gate voltage of the main switching device 2 caused by the gate drive unit 62. For example, the driving condition changing unit 63 switches the object to be connected to the gate from the gate resistor 6301 having a large resistance value to the gate resistor 6302 having a small resistance value. Note that, in the present embodiment, as an example, since the flag signal is maintained at a high level from the moment when it is detected that the voltage $V_{ds}$ is at a peak until at least when the current between the drain and the source of the main switching device 2 is cut off, the driving condition changing unit 63 may connect the gate resistor 6302 to the gate until at least the current between the drain and the source of the main switching device 2 is cut off. The driving condition changing unit 63 may switch the connection object to the gate from the gate resistor 6302 to the gate resistor 6301 by the next time the main switching device 2 is turned off.

According to the above-described operations, since the gate resistor 6302 is connected to the gate from the moment when it is detected that the voltage $V_{ds}$ is at a peak until at least the current between the drain and the source is cut off, or until the voltage $V_{ds}$ turns into a direct current voltage Ed, the time required for turn-off can be reliably shortened, as compared to a case where the gate resistor 6301 is connected to the gate in the middle of turn-off.

3. Operation Waveforms

Figure 3:
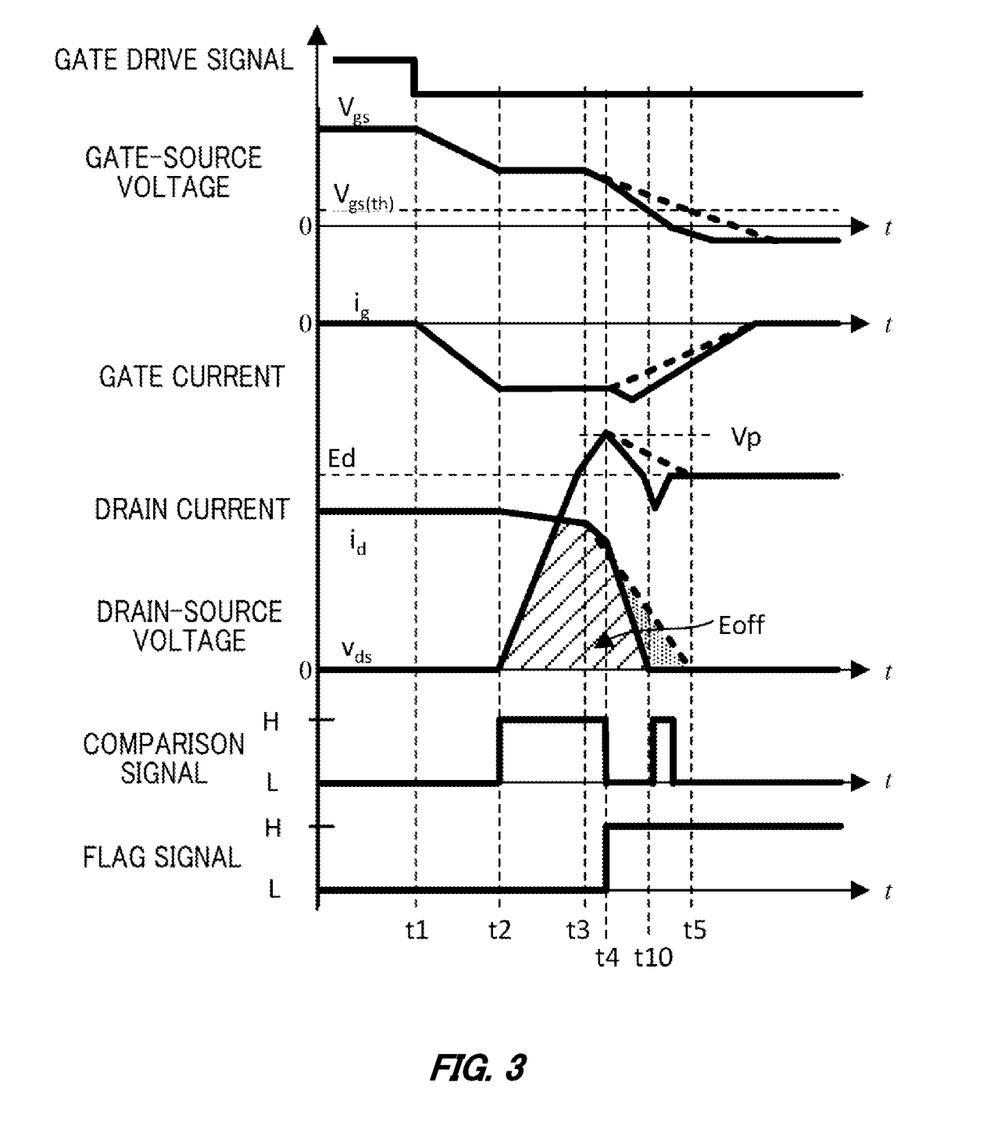
FIG. 3 shows operation waveforms of a main switching device 2 when being turned off.

FIG. 3 shows operation waveforms of a main switching device 2 when being turned off. Note that, the horizontal axis in the figure indicates the time, and the vertical axis indicates the input signal, the gate-source voltage $V_{gs}$, the drain-source voltage $V_{ds}$, the drain current Id or the like of the main switching device 2.

[3-1. Operation Waveform by a Switching Apparatus of a Comparative Example]

First, the operation waveform by the switching apparatus of the comparative example of the present embodiment at the time of turn-off is described. The switching apparatus of the comparative example does not include a peak detection unit 61 or the driving condition changing unit 63, and does not change the change speed of the gate voltage during a turn-off period. Note that, the operation waveform of the switching apparatus of the present comparative example is indicated by a dashed line in the figure, and partly overlaps with the operation waveform by the switching apparatus 100 described below which is indicated by a solid line.

When the input signal for controlling the main switching device 2 is switched from high (on-command) to low (off-command), the gate drive signal from the gate drive unit 62 becomes low at time point 1, and a negative gate current Ig (i.e. a current that flows from the gate of the main switching device 2 to the ground (not illustrated) of the gate drive apparatus 6 via the second switching device 622) starts to flow. In this manner, the gate drive signal for instructing the turn-off is output from the gate drive unit 62, and the gate charge starts being injected to the main switching device 2 in a reverse bias direction. Then, the gate input capacitance Cgs of the main switching device 2 is charged in a reverse bias direction during a period from time point t1 to t2, and the gate-source voltage $V_{gs}$ is reduced.

Next, when the gate-source voltage $V_{gs}$ is reduced to a mirror voltage (time point t2), most of the gate charge is used to charge a feedback capacitance (a gate-drain capacitance) Cgd, the change of the gate-source voltage $V_{gs}$ becomes flat (so-called Miller period), and the drain-source voltage $V_{ds}$ of the main switching device 2 increases.

In accordance with this, the drain-source voltage $V_{ds}$ of the main switching device 1 opposing the main switching device 2 is lowered and a discharge current flows from its parasitic capacitance Cds, thereby reducing the drain current Id of the main switching device 2, and a voltage VL according to the change rate of that current is applied to the main switching device 2.

Then, at time point t3, the Miller period ends at the main switching device 2 and the drain current Id is drastically decreased (becomes zero at time point t5). In this manner, the voltage applied to the wiring inductance of the positive-side power supply line 101 increases instantaneously, and the drain-source voltage $V_{ds}$ of the main switching device 2 increases up to the peak voltage Vp (time point t4). Subsequently, the drain-source voltage $V_{ds}$ decreases and turns into a direct current voltage Ed at time point t5, and the gate source voltage $V_{gs}$ falls below a gate threshold voltage $V_{gs(th)}$.

Then, the charging to the gate input capacitance Cgs of the main switching device 2 ends and the turn-off of the main switching device 2 is completed. In the present comparative example, a turn-off loss Eoff occurs, which is conceptually indicated by a hatching area of hatched lines and dots. Note that, when the turn-off of the main switching device 2 is completed, the turn-on of the main switching device 1 may be performed.

[3-2. Operation Waveform of a Switching Apparatus 100 of an Embodiment]

Next, an operation waveform by the switching apparatus 100 of the present embodiment at the time of turn-off is described. Note that, the operation waveform by the switching apparatus 100 is illustrated with a solid line. Descriptions of the portions of the operation waveform that are similar to the comparative example are omitted.

In the switching apparatus 100 according to the present embodiment, when the drain-source voltage $V_{ds}$ starts increasing at time point t2, a parameter indicating that the change rate is a positive value is detected by the differential processing unit 616. In addition, a comparison signal at a high level indicating that said parameter is larger than a reference value (in the present exemplary operation, a value indicating that the change rate is zero, as an example) is output from the comparator 617.

In addition, when the drain-source voltage $V_{ds}$ of the main switching device 2 starts decreasing from the peak voltage Vp at time point t4, a parameter indicating that the change rate of the voltage $V_{ds}$ is a negative value is detected by the differential processing unit 616. In addition, a comparison signal at a low level indicating that said parameter is smaller than a reference value (in the present exemplary operation, a value indicating that the change rate is zero, as an example) is output from the comparator 617. In this manner, it is detected by the detection unit 618 that the voltage $V_{ds}$ is at a peak according to the falling of the comparison signal, and a flag signal for changing the gate drive condition rises. As a result, the resistance value of the gate resistor 630 is reduced by the driving condition changing unit 63, the change speed of the gate source voltage $V_{gs}$ increases, and the falling becomes steeper than the operation waveform of the comparative example. Therefore, in the present exemplary operation, unlike in the comparative example, the drain-source voltage $V_{ds}$ turns into a direct current voltage Ed and the gate source voltage $V_{gs}$ falls below the gate threshold voltage $V_{gs(th)}$, at time point t10, which is before time point t5.

Then, the charging to the gate input capacitance Cgs of the main switching device 2 ends and the turn-off of the main switching device 2 is completed. Note that, in the present exemplary operation, since the drain-source voltage $V_{ds}$ increases again to turn into a direct current voltage Ed after time point t10, rising and falling of the comparison signal will occur, but the connection of the gate resistor 6302 to the gate is maintained after time point t4.

As described above, according to the present exemplary operation, since the change speed of the gate source voltage $V_{gs}$ increases at the time of turn-off of the main switching device 2 and the falling becomes steeper than the operation waveforms of the comparative example, the time required for turn-off is shortened from a period from time point t1 to t5 to a period from time point t1 to t10. Therefore, a turn-off loss Eoff which is conceptually indicated by a hatching area of hatched lines in the figure is reduced as compared to the comparative example. In addition, increase in the peak voltage, and thus, in the surge voltage is prevented, since the change speed of the gate voltage increases after the peak of the voltage $V_{ds}$.

4. Modified Example

Figure 4:
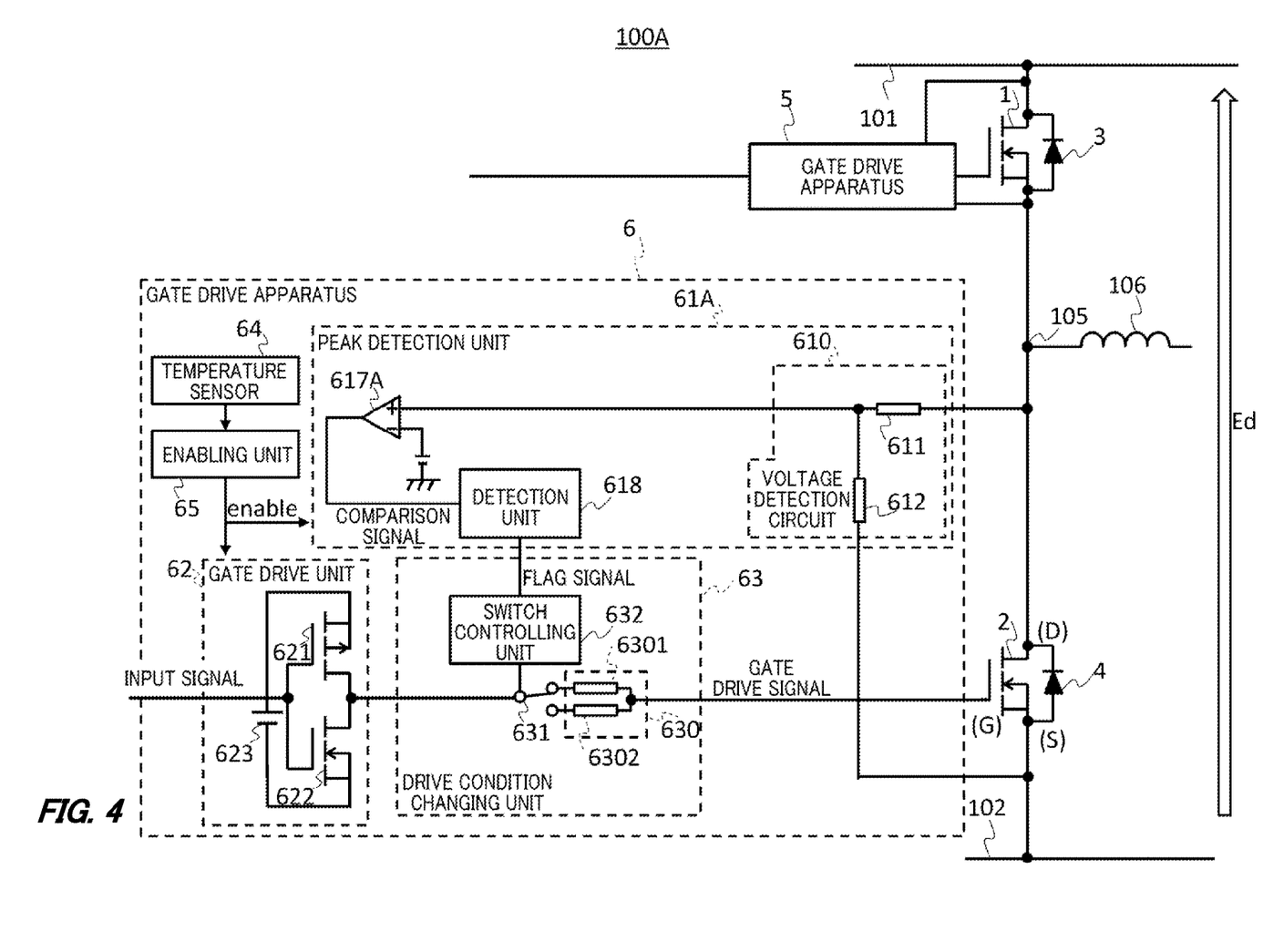
FIG. 4 shows a switching apparatus 100A according to a modified example.

FIG. 4 shows a switching apparatus 100A according to a modified example. The switching apparatus 100A includes a peak detection unit 61A.

The peak detection unit 61A includes a comparator 617A. The comparator 617A compares a parameter according to the voltage $V_{ds}$ with a reference value indicating that the voltage $V_{ds}$ is a peak voltage Vp. In the present embodiment, as an example, a non-inverting input terminal of the comparator 617A receives a voltage $V_{ds}$, and an inverting input terminal receives a voltage indicating the reference value.

According to the switching apparatus 100A described above, since a value according to the voltage $V_{ds}$ is used as the parameter, and a value indicating that the voltage $V_{ds}$ is a peak voltage Vp is used as the reference value respectively for comparison to detect that the voltage $V_{ds}$ is at a peak, it can be reliably detected that the voltage $V_{ds}$ is at a peak. In addition, the configuration can be simplified as compared to a case where a differential processing unit 616 is used.

5. Other Modified Example

Note that, although, in the above-described embodiments and modified examples, the low-pass filter 615 has been described as being provided at the front part of the differential processing unit 616, it may be provided at the back part of the differential processing unit 616 (between the differential processing unit 616 and the comparator 617, as an example). In this case, it can also be reliably detected that the voltage $V_{ds}$ is at a peak by reducing the influence of noises.

In addition, although the reference value used by the comparator 617 has been described as being a value indicating that the change rate of the voltage $V_{ds}$ is zero, it may be a value indicating that the change rate is a reference change rate having a negative value. In this case, since it is detected that the voltage $V_{ds}$ has fallen steeper than a reference change rate, misdetection of a peak can be prevented in a case where the voltage $V_{ds}$ gradually turns into a maximum value which is smaller than the peak voltage Vp due to the influence of noises or the like before the peak voltage Vp.

In addition, the reference value may be a value indicating that the change rate of the voltage $V_{ds}$ is a reference change rate having a positive value (a change rate when the voltage $V_{ds}$ increases gradually near the peak voltage Vp, as an example). In this case, since it is detected that the voltage $V_{ds}$ is at a peak before the timing when the voltage $V_{ds}$ is actually at a peak, the timing of changing the driving condition can be synchronized with the peak timing, taking into consideration the delay between the moment of the falling (or the rising) of a comparison signal and the moment when the driving condition is changed. In a similar manner, although the reference value used by the comparator 617A has been described as the value indicating that the voltage $V_{ds}$ is a peak voltage Vp, it may be a value smaller than the peak voltage Vp.

In addition, it has been described that the driving condition changing unit 63 reduces the resistance value of the gate resistor 630 connected to the gate in a case where it is detected that the voltage $V_{ds}$ is at a peak as compared to a case where it is not detected that the voltage $V_{ds}$ is at a peak. Additionally/alternatively, driving condition changing unit 63 may increase a gate current of the main switching device 2 in a case where it is detected that the voltage $V_{ds}$ is at a peak as compared to a case where it is not detected that the voltage $V_{ds}$ is at a peak. In this case, the change speed of the gate voltage can be increased during a turn-off period of the main switching device 2.

In addition, although the switching apparatus 100 and 200 have been described as including a set of the main switching device 1 and the driving apparatus 5 on the positive-side, and a set of the main switching device 2 and the driving apparatus 6 on the negative-side, they may only include either one of the sets.

In addition, although each unit of the gate drive apparatus 6 has been described as an analog circuit, at least one of the low-pass filter 615, the differential processing unit 616, the detection unit 618, and the enabling unit 65 may be a digital circuit.

In the above-described example, the positive-side main switching device 1 and the negative-side main switching device 2 have each been described as being one device, but they may each include two or more switching devices connected in parallel. In this case, a driving apparatus 5 (or 6) may be provided on each of the two or more positive-side (or the negative-side) switching devices, or may be provided together on the two or more positive-side (or the negative-side) switching devices.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: main switching device, 2: main switching device, 3: freewheeling diodes, 4: freewheeling diodes, 5: driving apparatus, 6: driving apparatus, 61: peak detection unit, 62: gate drive unit, 63: driving condition changing unit, 64: temperature sensor, 65: enabling unit, 100: switching apparatus, 101: positive-side power supply line, 102: negative-side power supply line, 105: power supply output terminal, 106: induction load, 610: voltage detection circuit, 611:

resistor, 612: resistor, 615: low-pass filter, 616: differential processing unit, 617: comparator, 618: detection unit, 621: first switching device, 622: second switching device, 623: power source, 630: gate resistor, 631: connection switch unit, 6301: gate resistor, 6302: gate resistor

What is claimed is:

1. A gate drive apparatus comprising:
    a gate drive unit configured to drive a gate of a switching device;
    a peak detection unit configured to detect that a voltage across main terminals applied between the main terminals of the switching device during a turn-off period of the switching device is at a peak; and
    a driving condition changing unit configured to increase a change speed of a gate voltage of the switching device caused by the gate drive unit, in response to a detection that the voltage across main terminals is at the peak.

2. The gate drive apparatus according to claim 1, wherein the peak detection unit includes:
    a voltage detection circuit configured to detect the voltage across main terminals;
    a comparator configured to compare a parameter according to the voltage across main terminals with a reference value; and
    a detection unit configured to detect that the voltage across main terminals is at the peak, based on a comparison result obtained by the comparator.

3. The gate drive apparatus according to claim 2, wherein:
    the peak detection unit further includes a differential processing unit configured to detect, as the parameter, a value according to a change rate of the voltage across main terminals; and
    the comparator is configured to compare the parameter with the reference value indicating that the change rate is a reference change rate that is equal to or below zero.

4. The gate drive apparatus according to claim 3, wherein the peak detection unit further includes a low-pass filter at a front part or a back part of the differential processing unit.

5. The gate drive apparatus according to claim 2, wherein the comparator is configured to compare the parameter with the reference value indicating that the voltage across main terminals is at the peak.

6. The gate drive apparatus according to claim 1, wherein the driving condition changing unit is configured to reduce a resistance value of a gate resistor connected to the gate in a case where it is detected that the voltage across main terminals is at the peak as compared to a case where it is not detected that the voltage across main terminals is at the peak.

7. The gate drive apparatus according to claim 6, wherein the driving condition changing unit is configured to reduce the resistance value of the gate resistor connected to the gate from a moment when it is detected that the voltage across main terminals is at the peak at least until a current between the main terminals of the switching device is cut-off, or until the voltage across main terminals turns into a direct current voltage applied between the main terminals.

8. The gate drive apparatus according to claim 1, wherein the driving condition changing unit is configured to increase a gate current of the switching device in a case where it is not detected that the voltage across main terminals is at the peak as compared to a case where it is detected that the voltage across main terminals is at the peak.

9. The gate drive apparatus according to claim 1, further comprising:
    a temperature sensor configured to measure a temperature of the switching device; and
    an enabling unit configured to enable the peak detection unit and the driving condition changing unit in response to the temperature being higher than a reference temperature.

10. A switching apparatus comprising:
    a gate drive apparatus according to claim 1; and
    the switching device of which a gate is to be driven by the gate drive apparatus.

11. The switching apparatus according to claim 10, wherein the switching device is a wide bandgap semiconductor element.

* * * * *